(12) United States Patent
Kodama

(10) Patent No.: US 7,142,465 B2
(45) Date of Patent: Nov. 28, 2006

(54) SEMICONDUCTOR MEMORY

(75) Inventor: Tsuyoshi Kodama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/073,596

(22) Filed: Mar. 8, 2005

(65) Prior Publication Data
US 2006/0092720 A1    May 4, 2006

(30) Foreign Application Priority Data
Nov. 2, 2004    (JP)    ............... 2004-319138

(51) Int. Cl.
*G11C 7/02*    (2006.01)
*G11C 7/12*    (2006.01)
(52) U.S. Cl. ............ 365/189.11; 365/203; 365/230.05; 365/202
(58) Field of Classification Search ........... 365/189.11, 365/202, 203, 189.09, 230.05, 204
See application file for complete search history.

(56) References Cited

U.S. PATENT DOCUMENTS 5,875,139 A * 2/1999 Semi .................. 365/203
6,130,846 A * 10/2000 Hori et al. .................. 365/203

FOREIGN PATENT DOCUMENTS

JP    10-112185    4/1998

* cited by examiner

*Primary Examiner*—Amir Zarabian
*Assistant Examiner*—Michael Weinberg
(74) *Attorney, Agent, or Firm*—Arent Fox PLLC

(57) ABSTRACT

A semiconductor memory in which a drop in the potential of a bit line due to coupling capacitance at the time of writing data can be restored in a space-saving way without increasing a load at read time. In response to a selection signal, a selection circuit selects complementary bit lines and connects the selected complementary bit lines to write data bus lines or read data bus lines. When data is written, a voltage boosting circuit section selects a read data bus line connected to a bit line of the pair of complementary bit lines located opposite to a bit line the potential of which is decreased on the basis of the data to be written and raises the potential of the selected read data bus line. As a result, a potential level which has dropped due to coupling capacitance between the bit lines can be restored.

6 Claims, 8 Drawing Sheets

SEMICONDUCTOR MEMORY

CROSS-REFERENCE TO RELATED APPLICATIONS

This application is based upon and claims the benefits of priority from the prior Japanese Patent Application No. 2004-319138, filed on Nov. 2, 2004, the entire contents of which are incorporated herein by reference.

BACKGROUND OF THE INVENTION (1) Field of the Invention

This invention relates to a semiconductor memory and, more particularly, to a semiconductor memory with a plurality of memory cells arranged in row and column directions like a matrix and connected between complementary bit lines.

(2) Description of the Related Art

FIG. 5 is a circuit diagram showing an example of memory cells included in static random access memories (SRAMs).

A memory cell 700 in an SRAM includes n-channel metal oxide semiconductor (MOS) field effect transistors (NMOSes) 701 and 702 and inverters 703 and 704 between complementary bit lines BL and /BL. One input-output terminal of the NMOS 701 is connected to the bit line BL and one input-output terminal of the NMOS 702 is connected to the bit line /BL. The other input-output terminal of the NMOS 701 is connected to an input terminal of the inverter 703 and the other input-output terminal of the NMOS 702 is connected to an output terminal of the inverter 703. The other input-output terminal of the NMOS 702 is connected to an input terminal of the inverter 704 and the other input-output terminal of the NMOS 701 is connected to an output terminal of the inverter 704. A common word line WL is connected to gates of the NMOSes 701 and 702.

FIGS. 6A and 6B are views showing potential levels at the time of a conventional SRAM being written. FIG. 6A is a view showing the potential levels of the word line and the complementary bit lines. FIG. 6B is a view showing the potential levels of the word line and nodes c and cx shown in FIG. 5.

It is assumed that an SRAM is written. Usually the potential Vb1 of one (the bit line BL in FIG. 6A, for example) of the complementary bit lines BL and /BL is decreased from a power supply voltage (VDD) level to a ground (VSS) level and the potential Vb2 of the other (the bit line /BL in FIG. 6A) is kept at the VDD level. By doing so, a great potential difference arises between the bit lines BL and /BL to which the memory cell is connected. In addition, the word line WL is activated (its potential Vw is increased to the VDD level). As shown in FIG. 6B, the potential Vc of the node c and the potential Vcx of the node cx are inverted to write data into this memory cell.

In this case, however, the potential Vb2 of the bit line /BL which must be kept at the VDD level may drop with the change in the potential Vb1 of the bit line BL from the VDD level to the VSS level due to, for example, coupling capacitance 705 between the complementary bit lines BL and /BL. If the potential Vb2 of the bit line /BL drops and a great potential difference does not arise between the complementary bit lines BL and /BL, there may be a delay in an inversion of memory cell data or in the worst case the data cannot be written into the memory cell.

Conventionally, the following semiconductor memory has been known as a device which can solve this problem.

FIG. 7 is a circuit diagram of a conventional semiconductor memory.

A semiconductor memory 800 includes a plurality of memory cells 801 which are arranged in row and column directions like a matrix and which are connected between complementary bit lines BL and /BL, a column selection circuit 802, data bus lines 803a and 803b, a precharge circuit 804, a sense amplifier 805, and a write amplifier 806. In FIG. 7, word lines WL connected to the plurality of memory cells 801 are not shown.

The column selection circuit 802 includes an NMOS 802a and a p-channel MOS field effect transistor (PMOS) 802b which connect the data bus line 803a to one bit line BL of the complementary bit lines in response to a column selection signal (not shown) and a PMOS 802c and an NMOS 802d which connect the data bus line 803b to the other bit line /BL in response to the column selection signal.

The precharge circuit 804 includes PMOSes 804a, 804b, and 804c. The precharge circuit 804 precharges the data bus lines 803a and 803b to a VDD level in response to a precharge/equalize control signal inputted to gates of the PMOSes 804a, 804b, and 804c to make the potential of the data bus lines 803a and 803b equal.

At read operation time, the sense amplifier 805 detects and amplifies a difference in potential between the data bus lines 803a and 803b to read out data stored in a memory cell 801 selected.

The write amplifier 806 includes PMOSes 806a and 806b, NMOSes 806c and 806d, and inverters 806e, 806f, 806g, and 806h. When complementary data to be written (data to be written and /data to be written) is inputted, the potential of the data bus lines 803a and 803b is set to a VDD or VSS level to write the data into a memory cell 801.

In the semiconductor memory 800 having the above-mentioned structure, the bit line BL is connected to the data bus line 803a when both the NMOS 802a and the PMOS 802b turn on. The bit line /BL is connected to the data bus line 803b when both the PMOS 802c and the NMOS 802d turn on. Accordingly, by decreasing the potential of, for example, the data bus line 803a and increasing the potential of the data bus line 803b to the VDD level, it is possible to restore, via the PMOS 802c, the potential level of the bit line /BL which otherwise would have dropped due to coupling capacitance.

With the conventional semiconductor memory 800 shown in FIG. 7, however, the column selection circuit 802 connects the bit line BL and the data bus line 803a by turning on both the NMOS 802a and the PMOS 802b and connects the bit line /BL and the data bus line 803b by turning on both the PMOS 802c and the NMOS 802d, in response to a column selection signal (not shown). Accordingly, the number of transistors connected to the data bus lines 803a and 803b increases. In addition, the write amplifier 806 is connected to the data bus lines 803a and 803b. As a result, the load on each data bus line significantly increases. This greatly interferes with the driving of the bit lines BL and /BL and the data bus lines 803a and 803b when data is read out from a memory cell 801. Moreover, this may lead to a decrease in the operating speed of the sense amplifier 805. Therefore, read operation is not performed properly or the operating speed of the sense amplifier 805 decreases to stably perform read operation.

The following semiconductor memory in which read data bus lines are kept separate from write data bus lines has been known as a device which can solve these problems.

FIG. 8 is a circuit diagram of another conventional semiconductor memory.

A semiconductor memory 900 includes a plurality of memory cells 901 which are arranged in row and column directions like an array and which are connected between complementary bit lines BL and /BL, a bit line voltage boosting circuit section 902, a column selection circuit 903, write data bus lines 904a and 904b, read data bus lines 905a and 905b, a precharge circuit 906, a sense amplifier 907, and a write amplifier 908.

The bit line voltage boosting circuit section 902 includes PMOSes 902a and 902b. One input-output terminal of the PMOS 902a is connected to the bit line BL, a gate of the PMOS 902a is connected to the bit line /BL, and the other input-output terminal of the PMOS 902a is connected to a VDD terminal. One input-output terminal of the PMOS 902b is connected to the bit line /BL, a gate of the PMOS 902b is connected to the bit line BL, and the other input-output terminal of the PMOS 902b is connected to the VDD terminal.

The column selection circuit 903 includes NMOSes 903a and 903c and PMOSes 903b and 903d. The NMOS 903a connects the write data bus line 904a to the bit line BL of the pair of complementary bit lines in response to a column selection signal (not shown) inputted to its gate. The PMOS 903b connects the read data bus line 905a to the bit line BL in response to a column selection signal (not shown) inputted to its gate. The NMOS 903c connects the write data bus line 904b to the bit line /BL in response to the column selection signal inputted to its gate. The PMOS 903d connects the read data bus line 905b to the bit line /BL in response to the column selection signal inputted to its gate.

The precharge circuit 906 includes PMOSes 906a, 906b, and 906c. In response to a precharge/equalize control signal inputted to their gates, the precharge circuit 906 precharges the read data bus lines 905a and 905b to a VDD level and makes the potential of the read data bus lines 905a and 905b equal.

At read operation time, the sense amplifier 907 detects and amplifies a difference in potential between the read data bus lines 905a and 905b to read out data stored in a memory cell 901 selected.

The structure of the write amplifier 908 is the same as that of the write amplifier 806 shown in FIG. 7. When data to be written and /data to be written are inputted, the potential of the write data bus lines 904a and 904b is set to a VDD or VSS level to write the data into a memory cell 901.

In the semiconductor memory 900 having the above-mentioned structure, the bit line BL and the write data bus line 904a are connected only via the NMOS 903a and the bit line /BL and the write data bus line 904b are connected only via the NMOS 903c. There is no problem about the operation of decreasing the potential of one of the pair of bit lines. Unlike the semiconductor memory 800 shown in FIG. 7, however, it is impossible to restore the potential of the other which has dropped, as shown in FIG. 6, due to coupling capacitance to the VDD level. Accordingly, the semiconductor memory 900 includes the PMOSes 902a and 902b between the bit lines BL and /BL, being a pair of complementary bit lines. As a result, when the potential of, for example, the bit line BL is decreased to the VSS level, the PMOS 902b connected to the bit line /BL turns on and the potential of the bit line /BL can be restored to the VDD level. In addition, the read data bus lines are kept separate from the write data bus lines, so the load on each data bus line does not increase.

Conventionally, techniques for preventing data stored in a memory cell between bit lines which are not selected and which are next to selected bit lines from being lost by the influence of coupling capacitance at write operation time have been known. In Japanese Unexamined Patent Publication No. 10-112185 (paragraphs [0044]–[0049] and FIGS. 1 and 4), for example, a semiconductor memory in which a write precharge circuit for precharging, before write operation, a bit line, inputting a write precharge signal, and keeping the voltage of complementary bit lines high for a predetermined period of time is connected to each bit line is disclosed.

With the conventional semiconductor memory 900 shown in FIG. 8, however, the PMOSes 902a and 902b for restoring potential which has dropped due to coupling capacitance at write time must be located for each bit line. This leads to an increase in the area of the device.

Moreover, with the conventional semiconductor memory disclosed in, for example, Japanese Unexamined Patent Publication No. 10-112185 (paragraphs [0044]–[0049] and FIGS. 1 and 4), the write precharge circuit for keeping the voltage of complementary bit lines high for a predetermined period of time is connected to each bit line. As a result, the area of the device increases.

SUMMARY OF THE INVENTION

The present invention was made under the background circumstances described above. An object of the present invention is to provide a semiconductor memory in which a drop in the potential of a bit line due to coupling capacitance at the time of writing data can be restored in a space-saving way without increasing a load at read time.

In order to achieve the above-mentioned object, a semiconductor memory with a plurality of memory cells arranged in row and column directions like a matrix and connected between complementary bit lines is provided. This semiconductor memory comprises a selection circuit for selecting complementary bit lines in response to a selection signal, and for connecting the selected complementary bit lines to write data bus lines or read data bus lines; and a voltage boosting circuit section for selecting, at the time of writing data, a read data bus line connected to a bit line of the pair of complementary bit lines located opposite to a bit line the potential of which is decreased on the basis of the data to be written, and for raising the potential of the selected read data bus line.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described in detail with reference to the drawings.

Figure 1:
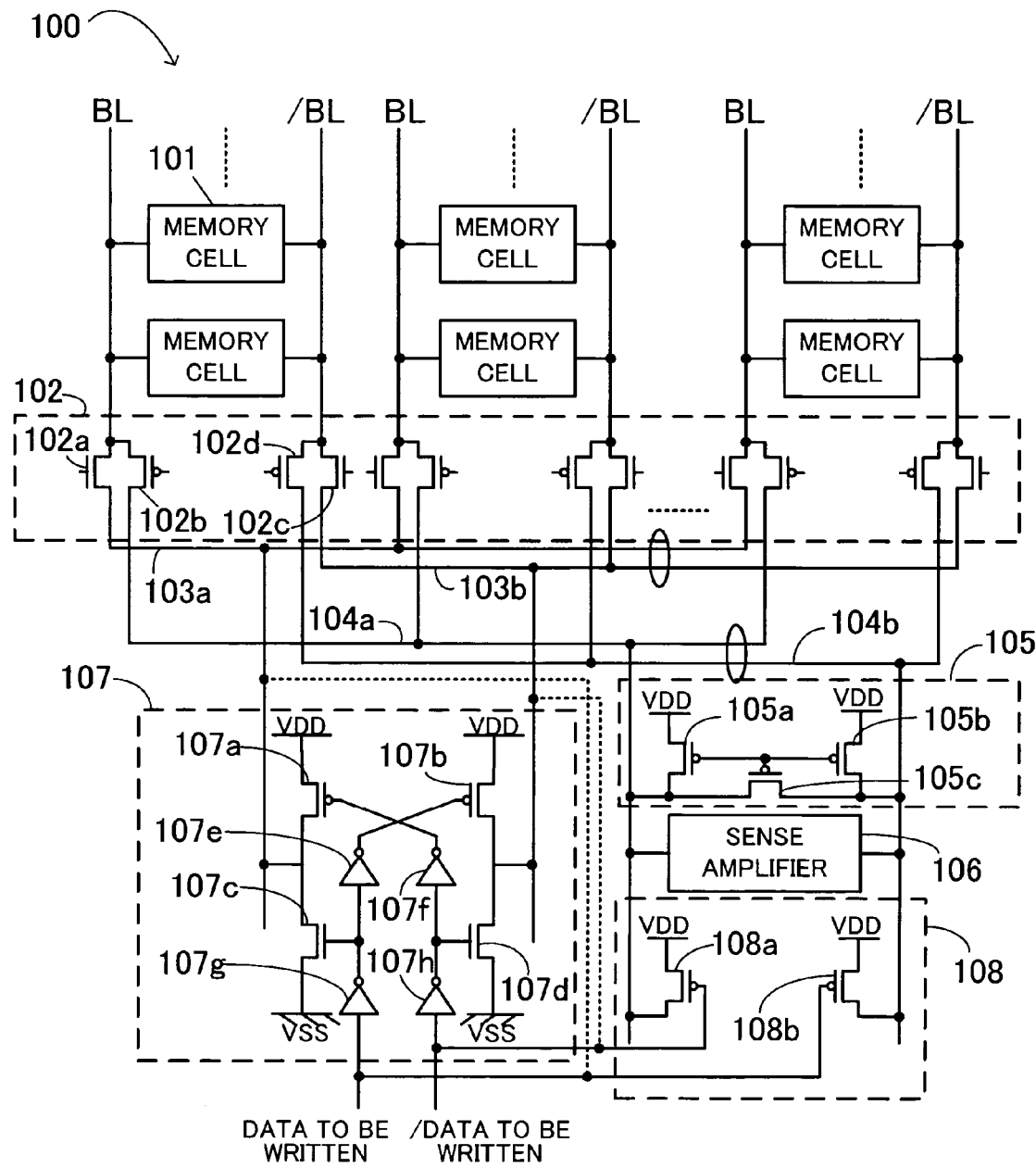
FIG. 1 is a circuit diagram of a semiconductor memory according to a first embodiment of the present invention.

FIG. 1 is a circuit diagram of a semiconductor memory according to a first embodiment of the present invention.

Figure 5:
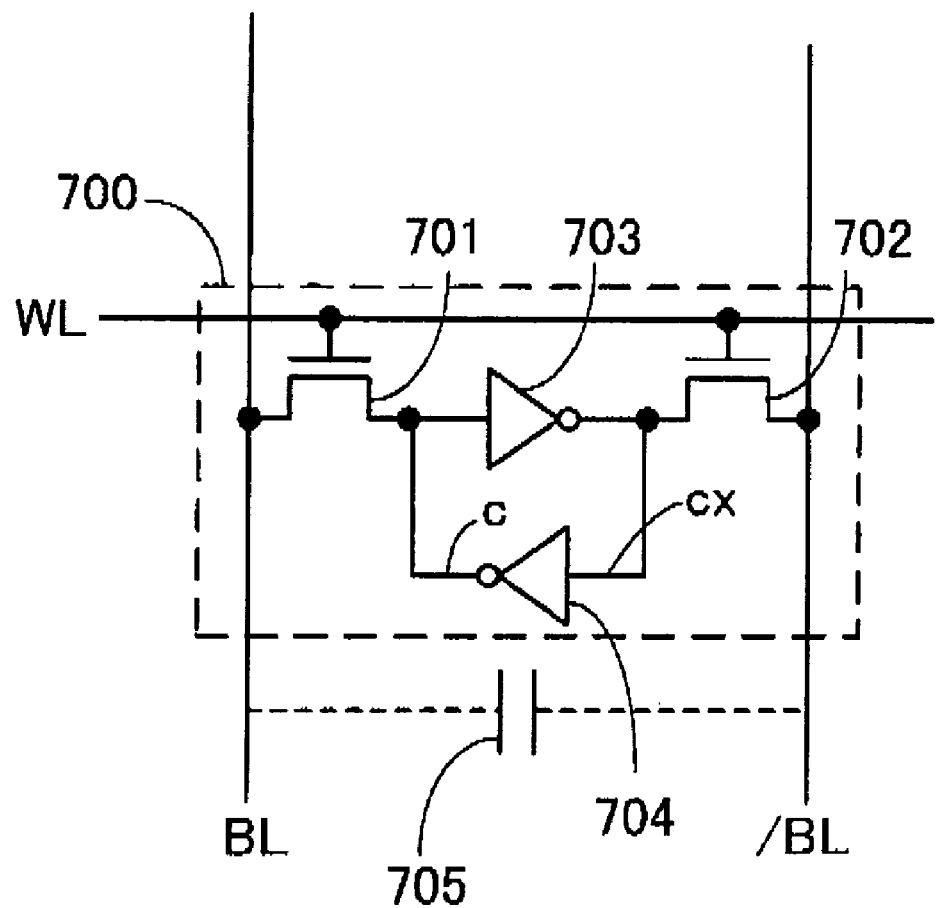
FIG. 5 is a circuit diagram showing an example of memory cells included in SRAMs.
Figure 6A:
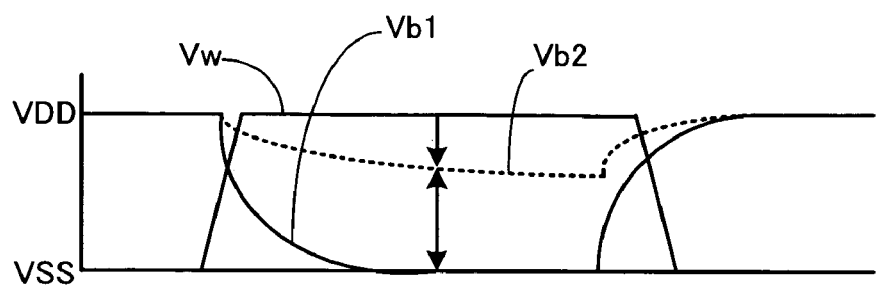
FIGS. 6A and 6B are views showing potential levels at the time of a conventional SRAM being written, FIG. 6A being a view showing the potential levels of a word line and complementary bit lines, FIG. 6B being a view showing the potential levels of the word line and nodes c and cx shown in FIG. 5.
Figure 6B:
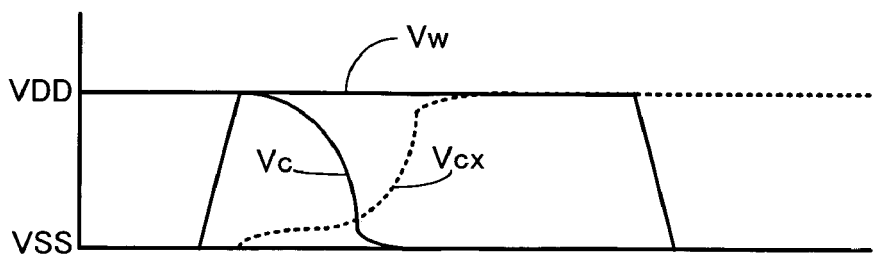
Figure 7:
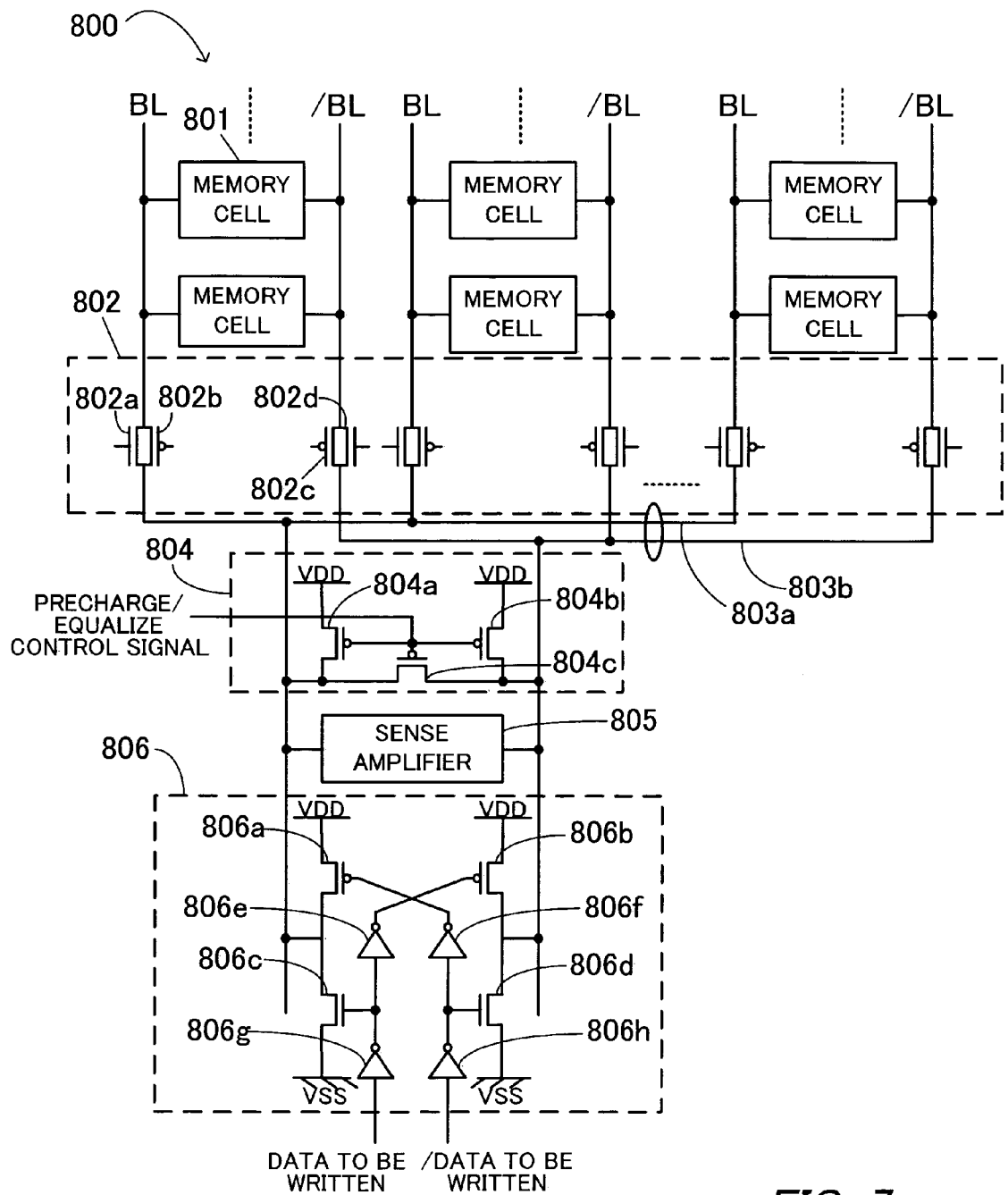
FIG. 7 is a circuit diagram of a conventional semiconductor memory.
Figure 8:
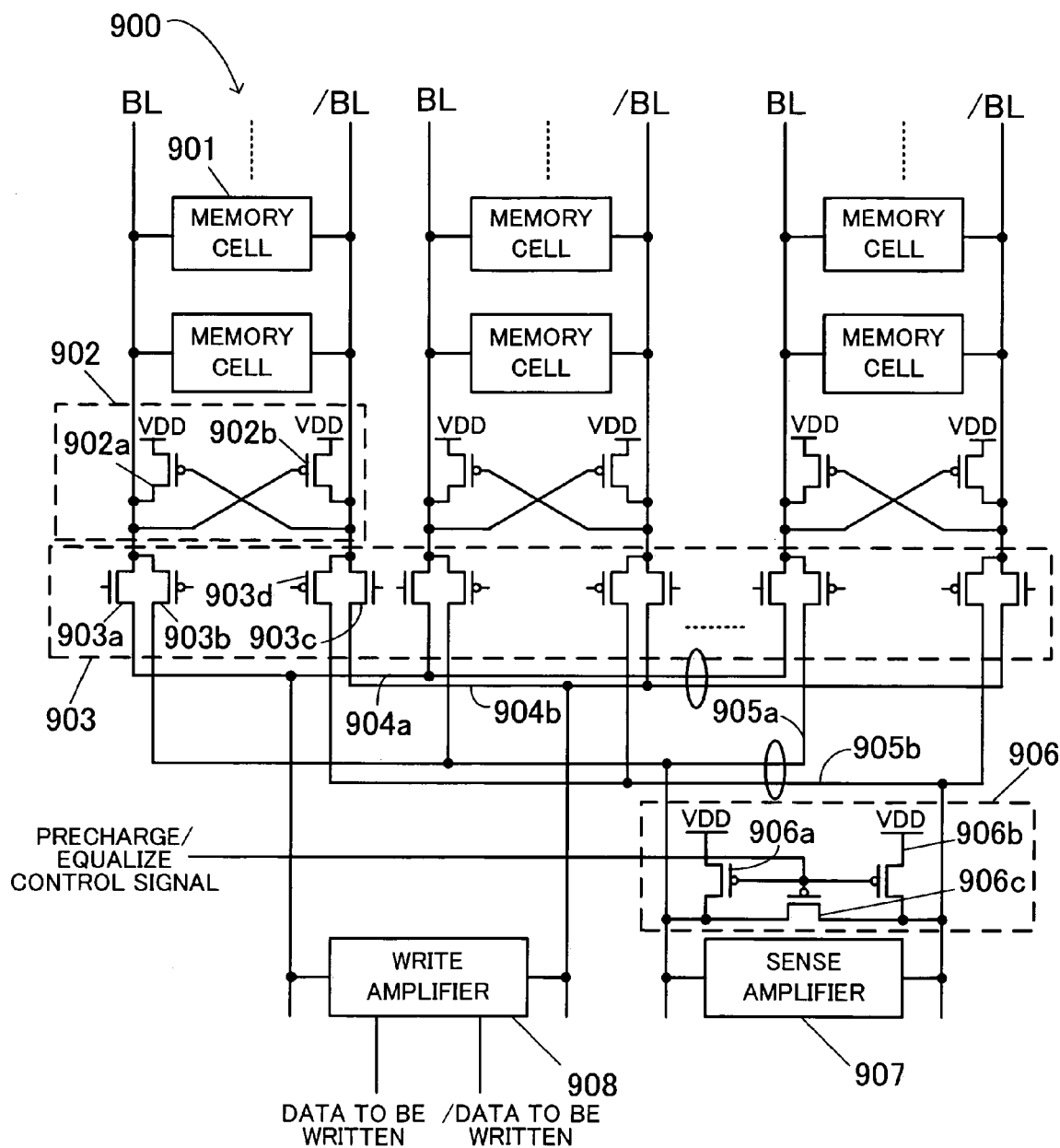
FIG. 8 is a circuit diagram of another conventional semiconductor memory.

A semiconductor memory 100 according to a first embodiment of the present invention includes a plurality of memory cells 101 which are arranged in row and column directions like a matrix and which are connected between complementary bit lines BL and /BL, a column selection circuit 102, write data bus lines 103a and 103b, read data bus lines 104a and 104b, a precharge circuit 105, a sense amplifier 106, a write amplifier 107, and a voltage boosting circuit section 108. In FIG. 1, word lines WL connected to the plurality of memory cells 101 are not shown (see FIG. 5).

In response to a column selection signal, the column selection circuit 102 selects bit lines BL and /BL and connects the bit lines BL and /BL to the write data bus lines 103a and 103b, respectively, or the read data bus lines 104a and 104b, respectively. The column selection circuit 102 includes NMOSes 102a and 102c and PMOSes 102b and 102d. The NMOS 102a connects the write data bus line 103a to the bit line BL of the pair of complementary bit lines. The PMOS 102b connects the read data bus line 104a to the bit line BL. The NMOS 102c connects the write data bus line 103b to the bit line /BL. The PMOS 102d connects the read data bus line 104b to the bit line /BL.

The precharge circuit 105 includes PMOSes 105a, 105b, and 105c. In response to a precharge/equalize control signal (not shown) inputted to their gates, the precharge circuit 105 precharges the read data bus lines 104a and 104b to a VDD level and makes the potential of the read data bus lines 104a and 104b equal. To be concrete, before read or write operation, a precharge/equalize control signal at a low level is inputted, the PMOSes 105a, 105b, and 105c turn on, and the read data bus lines 104a and 104b are precharged. During the read or write operation, the precharge/equalize control signal is at a high level and the PMOSes 105a, 105b, and 105c are in the off state.

At read operation time, the sense amplifier 106 detects and amplifies a difference in potential between the read data bus lines 104a and 104b to read out data stored in a memory cell 101 selected.

The write amplifier 107 includes PMOSes 107a and 107b, NMOSes 107c and 107d, and inverters 107e, 107f, 107g, and 107h. When data to be written and /data to be written are inputted, the potential of the write data bus lines 103a and 103b is set to a VDD or VSS level to write the data into a memory cell 101. The data to be written and the /data to be written are both "1" (at the high level) except at write operation time.

The voltage boosting circuit section 108 includes two PMOSes 108a and 108b. One input-output terminal of the PMOS 108a is connected to the read data bus line 104a and the other input-output terminal of the PMOS 108a is connected to a VDD terminal. The /data to be written complementary to the data to be written is inputted to a gate of the PMOS 108a. One input-output terminal of the PMOS 108b is connected to the read data bus line 104b and the other input-output terminal of the PMOS 108b is connected to the VDD terminal. The data to be written is inputted to a gate of the PMOS 108b. As shown by a dotted line in FIG. 1, two outputs of the write amplifier 107 may be inputted to the gate of the PMOS 108a and the gate of the PMOS 108b respectively.

The column selection circuit 102 will now be described in detail.

Figure 2:
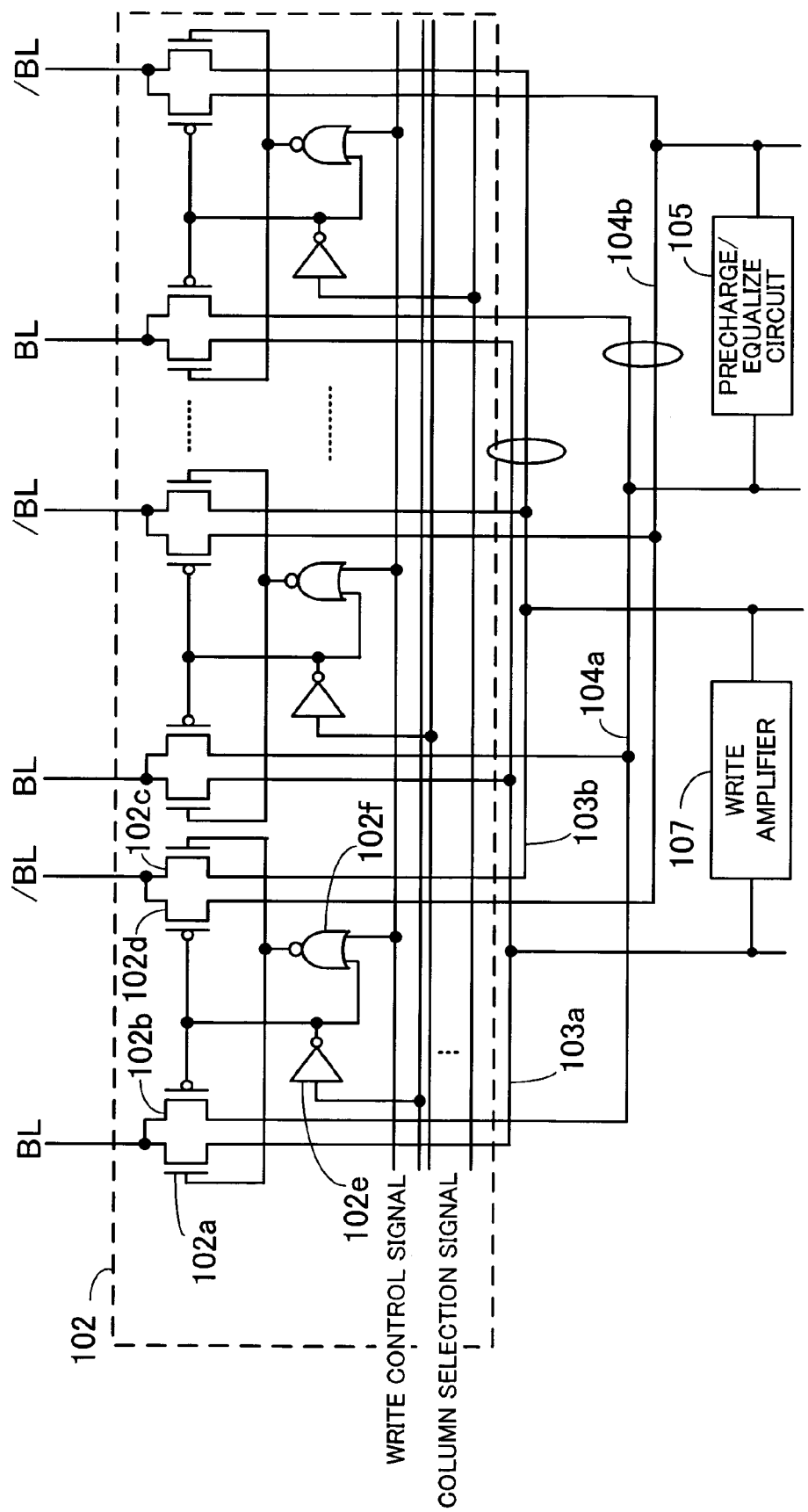
FIG. 2 is a circuit diagram mainly showing a column selection circuit included in the semiconductor memory according to the first embodiment of the present invention.

FIG. 2 is a circuit diagram mainly showing the column selection circuit included in the semiconductor memory according to the first embodiment of the present invention.

The column selection circuit 102 includes an inverter 102e for inverting the level of the column selection signal and inputting it to gates of the PMOSes 102b and 102d and a NOR circuit 102f for inputting the result of a NOR logical operation performed on output from the inverter 102e and a write control signal to gates of the NMOSes 102a and 102c. A column selection signal is inputted to each pair of bit lines and a pair of bit lines to which a column selection signal at the high level is inputted are selected. Usually the write control signal is kept at the high level and changes to the low level at write operation time.

When a column selection signal for selecting a pair of bit lines BL and /BL changes to the high level, PMOSes 102b and 102d connected to the pair of bit lines BL and /BL selected by the column selection signal turn on and the bit lines BL and /BL are connected to the read data bus lines 104a and 104b respectively. When the write control signal is at the high level, output from a NOR circuit 102f is at the low level, NMOSes 102a and 102c turn off, and read operation is performed. When the column selection signal is at the high level and the write control signal is at the low level, the output from the NOR circuit 102f changes to the high level, the NMOSes 102a and 102c turn on, the bit lines BL and /BL are connected to the write data bus lines 103a and 103b respectively, and write operation is performed.

The following circuit may be used as the column selection circuit 102. The following column selection circuit 110 also functions as a write amplifier.

Figure 3:
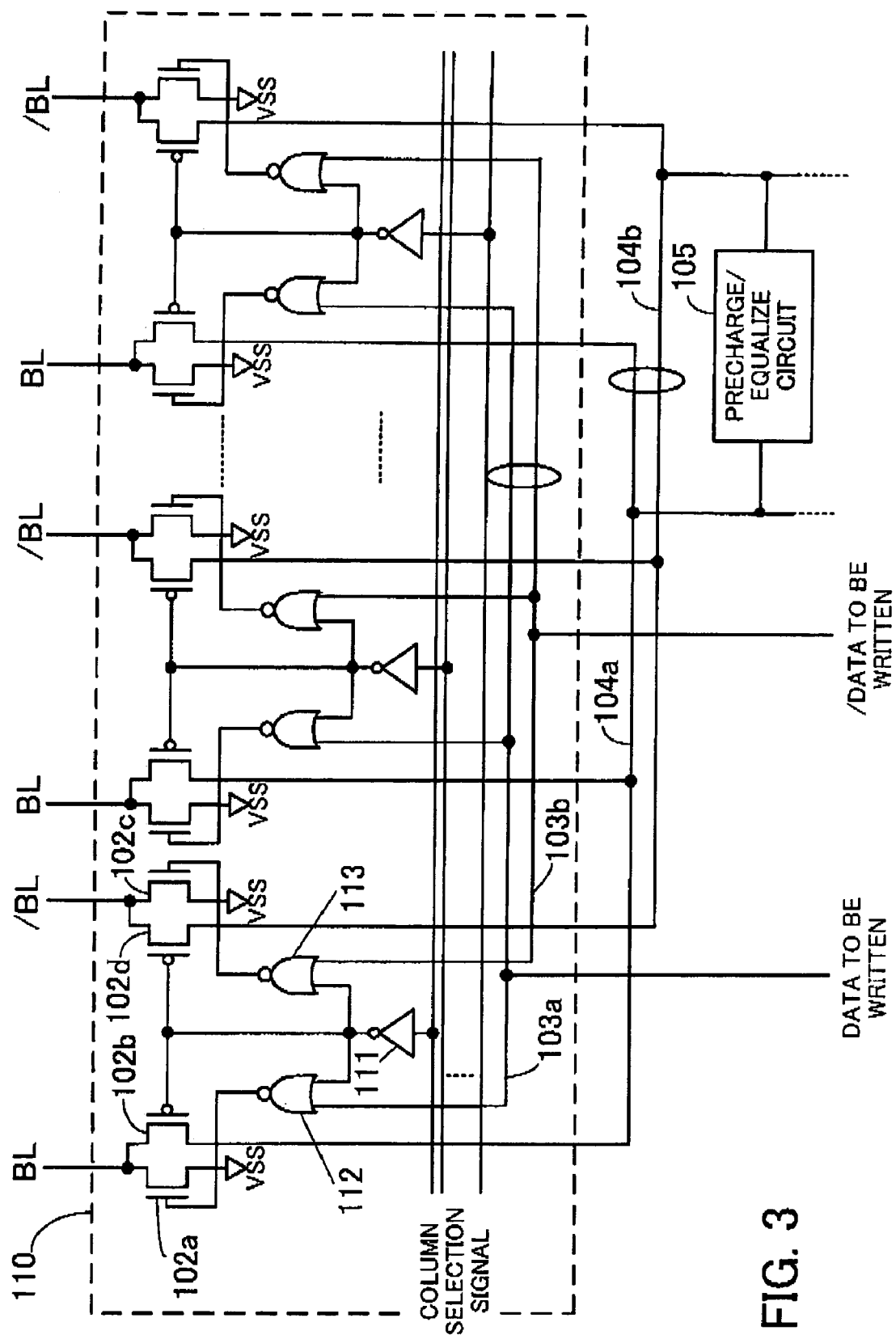
FIG. 3 is a circuit diagram showing another example of the column selection circuit.

FIG. 3 is a circuit diagram showing another example of the column selection circuit.

The column selection circuit 110 includes an inverter 111 for inverting the level of a column selection signal and inputting it to the gates of the PMOSes 102b and 102d, a NOR circuit 112 for inputting the result of a NOR logical operation performed on output from the inverter 111 and data to be written to the gate of the NMOS 102a, and a NOR circuit 113 for inputting the result of a NOR logical operation performed on the output from the inverter 111 and /data to be written to the gate of the NMOS 102c. The other input-output terminals of the NMOSes 102a and 102c connected to bit lines BL and /BL respectively are connected to a VSS terminal. A column selection signal is inputted to each pair of bit lines and a pair of bit lines to which a column selection signal at the high level is inputted are selected.

When a column selection signal for selecting a pair of bit lines BL and /BL changes to the high level, PMOSes 102b and 102d connected to the pair of bit lines BL and /BL selected by the column selection signal turn on and the bit lines BL and /BL are connected to the read data bus lines 104a and 104b respectively. When the data to be written and the /data to be written are both "1," outputs from the NOR circuits 112 and 113 are at the low level, NMOSes 102a and 102c turn off, and read operation is performed. When the column selection signal is at the high level, the data to be written is "0," and the /data to be written is "1," the output from the NOR circuit 112 changes to the high level, the NMOS 102a turns on, and the potential of the bit line BL changes to a VSS level. On the other hand, when the data to be written is "1" and the /data to be written is "0," the NMOS 102c turns on, and the potential of the bit line /BL changes to the VSS level. As described above, the column selection circuit 110 functions as a write amplifier.

The operation of the semiconductor memory 100 including the column selection circuit 102 shown in FIG. 2 will now be described. The same applies to the semiconductor memory 100 including the column selection circuit 110 shown in FIG. 3.

Before read or write operation is performed, the read data bus lines 104a and 104b are precharged first by the precharge circuit 105. Bit lines BL and /BL are connected to the read data bus lines 104a and 104b, respectively, by the column selection circuit 102, so the bit lines BL and /BL are also precharged.

When read operation is performed, a word line (not shown) is selected (activated). In the column selection circuit 102, PMOSes 102b and 102d connected to one of a plurality of pairs of bit lines BL and /BL are turned on by a column selection signal. By doing so, the pair of bit lines BL and /BL are selected and are connected to the read data bus lines 104a and 104b. As a result, data stored in a memory cell 101 connected to the activated word line and the selected pair of bit lines BL and /BL is read out by the sense amplifier 106. At this time a write control signal is at the high level, so NMOSes 102a and 102c are in the off state.

At this read operation time, only the PMOSes 102b and 102d in the column selection circuit 102 are turned on. Therefore, capacitance connected to the sense amplifier 106 and the selected bit lines BL and /BL decreases and high-speed read operation can be performed.

On the other hand, when write operation is performed, a word line (not shown) is selected (activated). In the column selection circuit 102, the column selection signal changes to the high level and the write control signal changes to the low level. NMOSes 102a and 102c and PMOSes 102b and 102d connected to one of the plurality of pairs of bit lines BL and /BL are turned on. By doing so, the pair of bit lines BL and /BL are selected and are connected to the write data bus lines 103a and 103b and the read data bus lines 104a and 104b. As a result, a memory cell 101 connected to the activated word line and the selected pair of bit lines BL and /BL is selected.

For example, when data to be written is "0" and /data to be written is "1," the potential of the write data bus line 103a drops to a VSS level and the potential of the bit line BL connected thereto also drops from a precharged level to the VSS level. The potential of the write data bus line 103b changes to a VDD level and the potential of the bit line /BL connected thereto also changes to the VDD level. In some conventional semiconductor memories, the potential of the bit line /BL which must be kept at the VDD level may drop with the change in the potential of the bit line BL due to coupling capacitance between the bit lines BL and /BL.

In the semiconductor memory 100 according to the first embodiment of the present invention, however, the potential of the bit line /BL is restored by the voltage boosting circuit section 108. That is to say, when the data to be written is "0" and the /data to be written is "1," the PMOSes 108a and 108b in the voltage boosting circuit section 108 turn off and on respectively. Accordingly, the potential of the read data bus line 104b connected to the PMOS 108b changes to the VDD level. The read data bus line 104b is connected to the bit line /BL by the PMOS 102d in the column selection circuit 102, so the potential of the bit line /BL can be restored to the VDD level. When the data to be written is "1" and the /data to be written is "0," it is necessary to decrease the potential of the bit line /BL to the VSS level and to keep the potential of the bit line BL at the VDD level. The PMOS 108a in the voltage boosting circuit section 108 turns on, so the potential of the read data bus line 104a changes to the VDD level. As a result, the potential of the bit line BL can be restored to the VDD level.

As stated above, when complementary data is written into a memory cell 101, the voltage boosting circuit section 108 can select a read data bus line (the read data bus line 104b, for example) connected to a bit line (the bit line /BL, for example) of the pair of complementary bit lines BL and /BL located opposite to a bit line (the bit line BL, for example) the potential of which is decreased on the basis of the complementary data to be written (the data to be written and the /data to be written) and raise the potential of the selected read data bus line 104b. In addition, there is no need to locate the voltage boosting circuit section 108 for each bit line. The voltage boosting circuit section 108 can be located at any appropriate place where it can be connected to the read data bus lines. This saves space.

A semiconductor memory according to a second embodiment of the present invention will now be described.

Figure 4:
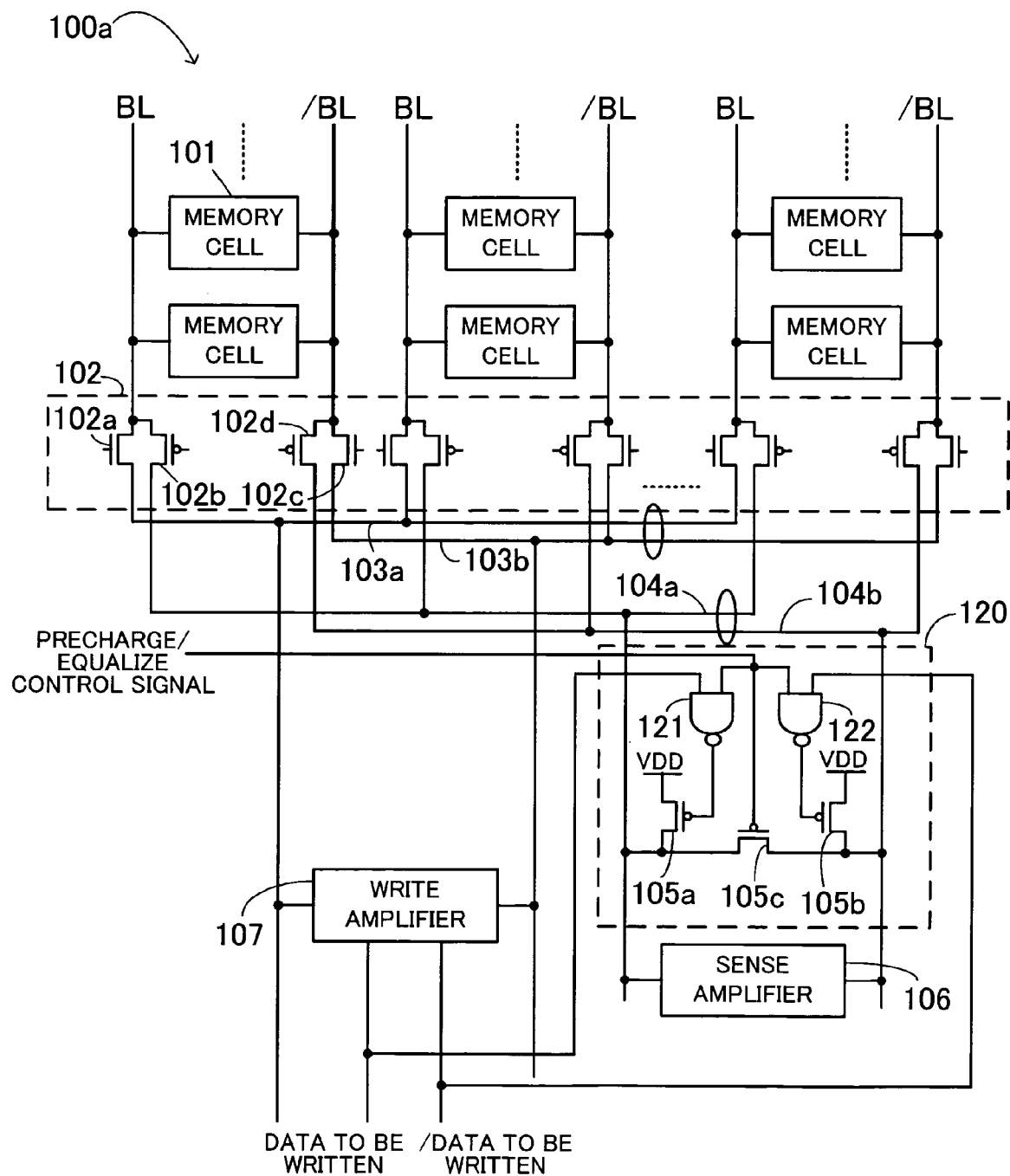
FIG. 4 is a circuit diagram of a semiconductor memory according to a second embodiment of the present invention.

FIG. 4 is a circuit diagram of a semiconductor memory according to a second embodiment of the present invention.

In a semiconductor memory 100a according to a second embodiment of the present invention, the function of the voltage boosting circuit section 108 included in the semiconductor memory 100 according to the first embodiment of the present invention is carried out by a precharge circuit 120. The other components in the semiconductor memory 100a are the same as those included in the semiconductor memory 100 according to the first embodiment of the present invention, so they are marked with the same symbols. The circuit shown in FIG. 2 or the circuit which is shown in FIG. 3 and which also functions as the write amplifier 107 may be used as a column selection circuit 102.

In the semiconductor memory 100a according to the second embodiment of the present invention, the precharge circuit 120 includes PMOSes 105a, 105b, and 105c, which are also included in the semiconductor memory 100 according to the first embodiment of the present invention, and two NAND circuits 121 and 122. Data to be written is inputted to one input terminal of the NAND circuit 121 and a precharge/equalize control signal is inputted to the other input terminal of the NAND circuit 121. Output from the NAND circuit 121 is inputted to a gate of the PMOS 105a. /Data to be written is inputted to one input terminal of the NAND circuit 122 and the precharge/equalize control signal is inputted to the other input terminal of the NAND circuit 122. Output from the NAND circuit 122 is inputted to a gate of the PMOS 105b.

In the precharge circuit 120, when the precharge/equalize control signal is at the low level, read data bus lines 104a and 104b are precharged to a VDD level and the potential of the read data bus lines 104a and 104b is made equal. This is the same with the precharge circuit 105 included in the semiconductor memory 100 according to the first embodiment of the present invention.

On the other hand, when the precharge/equalize control signal is at the high level, the potential of one of the read data bus lines 104a and 104b is set to the VDD level according to the complementary data to be written. To be concrete, when the data to be written is "0" and the /data to be written is "1," the PMOS 105a turns off, the PMOS 105b turns on, and the potential of the read data bus line 104b becomes the VDD level. When the data to be written is "1" and the /data to be written is "0," the PMOS 105a turns on, the PMOS 105b turns off, and the potential of the read data bus line 104a becomes the VDD level.

As stated above, when complementary data is written into a memory cell 101, the precharge circuit 120 included in the semiconductor memory 100a according to the second embodiment of the present invention can select a read data bus line (the read data bus line 104b, for example) connected to a bit line (the bit line /BL, for example) of the pair of complementary bit lines BL and /BL located opposite to a bit line (the bit line BL, for example) the potential of which is decreased on the basis of the complementary data to be written (the data to be written and the /data to be written) and raise the potential of the selected read data bus line 104b. In addition, there is no need to locate the precharge circuit 120 for each bit line. The precharge circuit 120 can be located at any appropriate place where it can be connected to the read data bus lines 104a and 104b. As a result, space can be saved as with the semiconductor memory 100 according to the first embodiment of the present invention.

In addition, in the semiconductor memory 100 according to the first embodiment of the present invention, the PMOSes 108a and 108b are connected to the read data bus lines 104a and 104b respectively. In the semiconductor memory 100a according to the second embodiment of the present invention, however, this is unnecessary. Therefore, capacitance connected to the read data bus lines 104a and 104b does not increase and a read rate can be increased further.

The semiconductor memory according to the present invention includes the voltage boosting circuit section for selecting, at the time of writing data, a read data bus line connected to a bit line of a pair of complementary bit lines located opposite to a bit line the potential of which is decreased on the basis of the data to be written and for raising the potential of the selected read data bus line. As a result, a drop in the level of potential due to coupling capacitance between the complementary bit lines can be restored. Moreover, there is no need to locate the voltage boosting circuit section for each bit line. The voltage boosting circuit section can be located at any appropriate place where it can be connected to the read data bus lines. This saves space.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory with a plurality of memory cells arranged in row and column directions like a matrix and connected between complementary bit lines, the memory comprising:

a selection circuit for selecting complementary bit lines in response to a selection signal, and for connecting the selected complementary bit lines to write data bus lines or read data bus lines; and a voltage boosting circuit section for selecting, at the time of writing data, a read data bus line connected to one of a pair of complementary bit lines located opposite to a bit line whose potential is decreased on the basis of data to be written, and for raising the potential of the selected read data bus line.

2. The semiconductor memory according to claim 1, wherein the voltage boosting circuit section includes two field-effect transistors for connecting, at the time of writing the data, the read data bus line connected to one of the pair of complementary bit lines located opposite to the bit line whose potential is decreased according to complementary data to be written inputted to gates thereof to a power supply voltage terminal.

3. The semiconductor memory according to claim 1, wherein when the selection circuit selects the pair of complementary bit lines, the selection circuit connects the read data bus lines to the pair of complementary bit lines both in the case of writing the data and in the case of reading data.

4. A semiconductor memory with a plurality of memory cells arranged in row and column directions like a matrix and connected between complementary bit lines, the memory comprising:

a selection circuit for selecting complementary bit lines in response to a selection signal, and for connecting the selected complementary bit lines to write data bus lines or read data bus lines; and a precharge circuit for precharging the read data bus lines, and for selecting, at the time of writing data, a read data bus line connected to one of a pair of complementary bit lines located opposite to a bit line whose potential is decreased on the basis of data to be written and raising the potential of the selected read data bus line.

5. The semiconductor memory according to claim 4, the precharge circuit includes two field-effect transistors controlled by a precharge/equalize control signal and the complementary data to be written for connecting, at the time of writing the data, the read data bus line connected to one of the pair of complementary bit lines located opposite to the bit line whose potential is decreased to a power supply voltage terminal.

6. The semiconductor memory according to claim 4, wherein when the selection circuit selects the pair of complementary bit lines, the selection circuit connects the read data bus lines to the pair of complementary bit lines both in the case of writing the data and in the case of reading data.

* * * * *